United States Patent

Hou et al.

Patent Number: 5,416,276
Date of Patent: May 16, 1995

[54] PRINTED CIRCUIT BOARD HAVING PROTECTING MEANS

[76] Inventors: Chin-Jung Hou; Suey Ku, both of 58, Ma Yuan West St., Taichung, Taiwan, Prov. of China

[21] Appl. No.: 246,686

[22] Filed: May 23, 1994

[51] Int. Cl.⁶ .................................................. H05K 1/02
[52] U.S. Cl. .................................. 174/255; 174/250; 361/748
[58] Field of Search .................... 434/317, 308, 309; 361/748; 174/250, 255, 268; 428/901

[56] References Cited

U.S. PATENT DOCUMENTS

| | | | |
|---|---|---|---|
| 3,697,668 | 10/1972 | Campbell | 174/68.5 |
| 5,093,183 | 3/1992 | Strunka | 428/195 |
| 5,209,665 | 3/1993 | Billings et al. | 434/169 |
| 5,226,822 | 7/1993 | Moris | 434/356 |

*Primary Examiner*—Leo P. Picard
*Assistant Examiner*—L. Thomas

[57] ABSTRACT

A printed circuit board includes a polyester film having a printed circuit applied to the bottom surface and a metal cover layer applied to the upper surface. An art printing paper is adhered to the metal cover layer. A number of patterns are printed on the art printing paper for indicating the sound that will be generated when the pattern is depressed. The printed circuit is covered by the metal cover layer and will not be exposed.

1 Claim, 4 Drawing Sheets

PRINTED CIRCUIT BOARD HAVING PROTECTING MEANS

BACKGROUND OF THE INVENTION

1. Field of the Invention

The present invention relates to a circuit board, and more particularly to a printed circuit board.

2. Description of the Prior Art

A typical printed circuit board is shown in FIGS. 1 and 2 and comprises a polyester film 1 having a printed circuit 11 provided thereon, and a cover layer 2 manually adhered to the polyester film 1 for covering the printed circuit 11. The circuit is exposed and may spoil the appearance of the circuit board.

The present invention has arisen to mitigate and/or obviate the afore-described disadvantages of the conventional printed circuit boards.

SUMMARY OF THE INVENTION

The primary objective of the present invention is to provide a printed circuit board in which the printed circuit will not be exposed.

In accordance with one aspect of the invention, there is provided a printed circuit board comprising a polyester film including an upper surface and a bottom surface, a printed circuit provided on the bottom surface of the polyester film, a metal cover layer applied to the upper surface of the polyester film, an art printing paper secured to the metal cover layer and having at least one pattern provided thereon, and a transparent film applied to the art printing paper for protecting the printed circuit board.

Further objectives and advantages of the present invention will become apparent from a careful reading of a detailed description provided hereinbelow, with appropriate reference to accompanying drawings.

DETAILED DESCRIPTION OF THE PREFERRED EMBODIMENT

Figure 1:
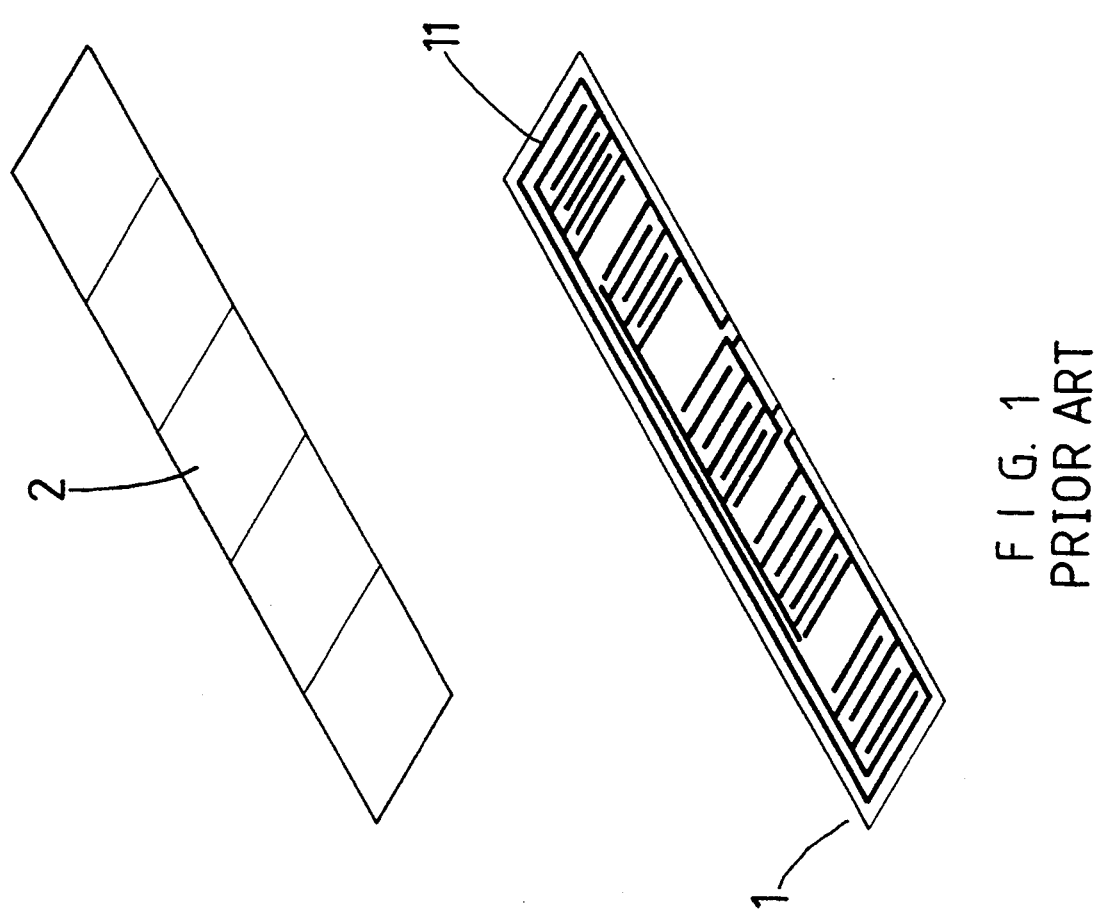
FIG. 1 is an exploded view of a typical printed circuit board.
Figure 2:
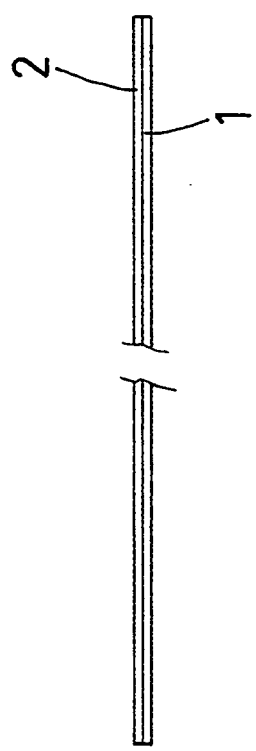
FIG. 2 is a front elevational view of the typical printed circuit board.
Figure 3:
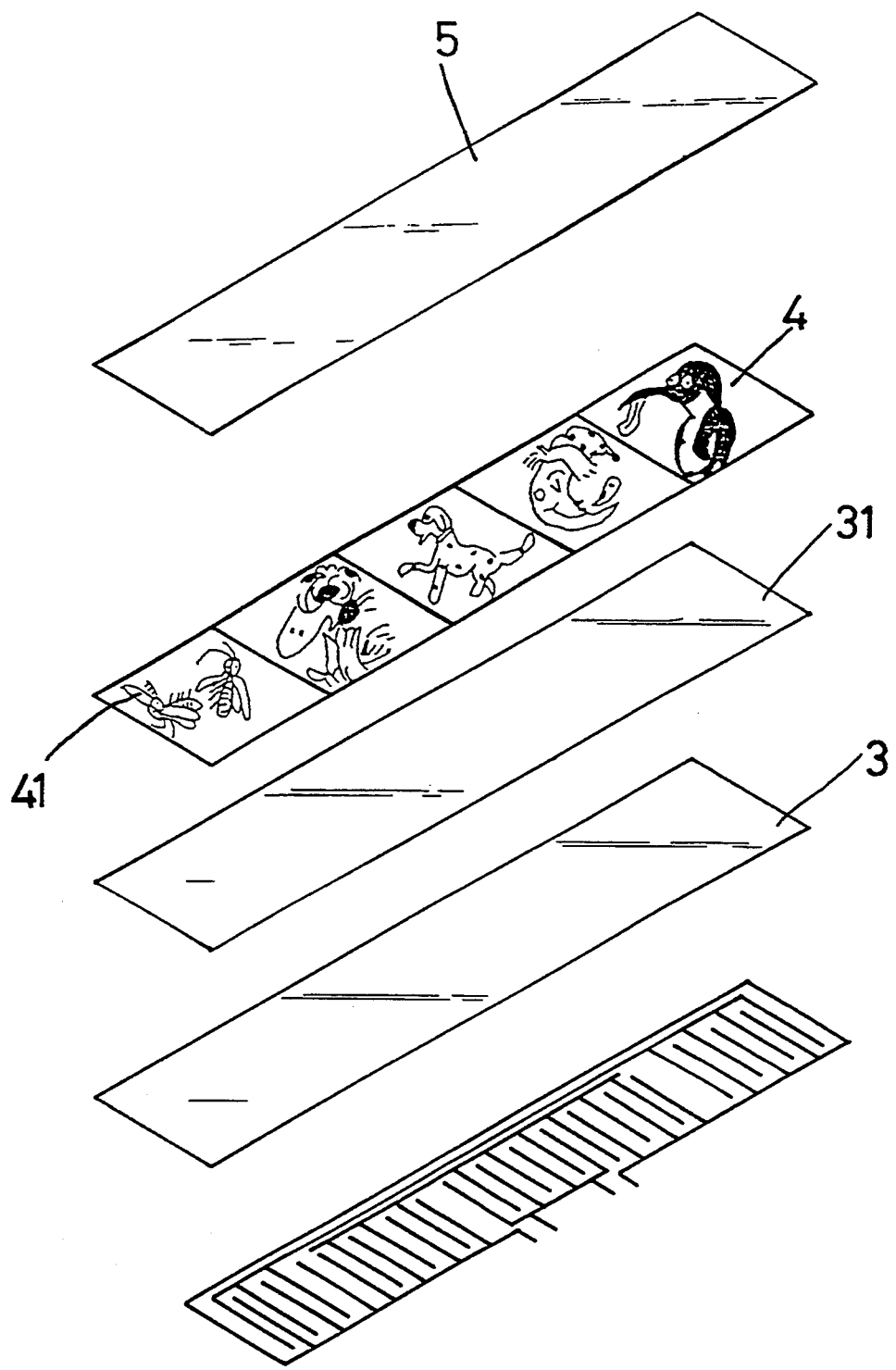
FIG. 3 is an exploded view of a printed circuit board in accordance with the present invention.
Figure 4:
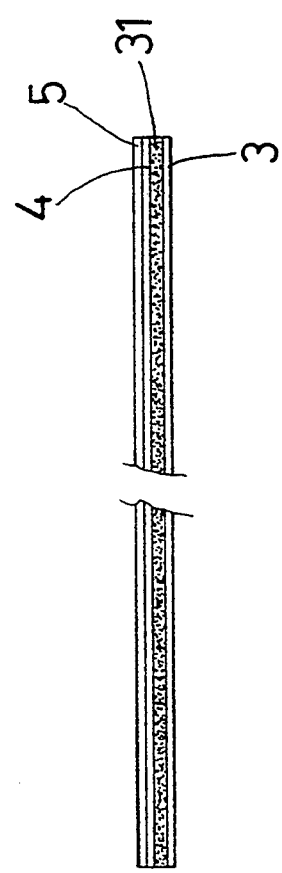
FIG. 4 is a front elevational view of the printed circuit board as shown in FIG. 3.

Referring to FIGS. 3 and 4, a printed circuit board in accordance with the present invention comprises a polyester film 3 having a printed circuit provided on the bottom surface thereof, a metal cover layer 31 applied onto the upper surface of the polyester film 3 by vacuum process and galvanizing process, an art printing paper 4 adhered to the metal cover layer 31 and including various kinds of patterns 41 printed thereon, and a transparent film 5 applied to the art printing paper 4 for covering and for protecting the printed circuit board.

In operation, when the dog pattern of the art printing paper 4 is depressed, the electric circuit not shown) may generate dog sound. Similarly, when the bee pattern is depressed, the electric circuit may generate bee sound.

It is to be noted that metal cover layer 31 is not transparent such that the printed circuit can not be seen. The art printing paper 4 further covers the printed circuit and provides a novel configuration for the printed circuit board. The polyester film 3 and the art printing paper 4 may be secured together with suitable adhering machine such that the printed circuit board can be made quickly. The transparent film 5 protects the printed circuit board from dirt.

Accordingly, the printed circuit board includes a printed circuit that will not be exposed and includes an art printing paper having a number of patterns provided thereon for indicating the sound that will be generated.

Although this invention has been described with a certain degree of particularity, it is to be understood that the present disclosure has been made by way of example only and that numerous changes in the detailed construction and the combination and arrangement of parts may be resorted to without departing from the spirit and scope of the invention as hereinafter claimed.

I claim:

1. A printed circuit board comprising a polyester film including an upper surface and a bottom surface, a printed circuit provided on said bottom surface of said polyester film, a metal cover layer applied to said upper surface of said polyester film, an art printing paper secured to said metal cover layer and having at least one pattern provided thereon, and a transparent film applied to said art printing paper for protecting said printed circuit board.

* * * * *